United States Patent
Backhaus-Ricoult et al.

(10) Patent No.: US 8,309,044 B2
(45) Date of Patent: Nov. 13, 2012

(54) EXHAUST GAS TREATMENT SYSTEM INCLUDING A THERMOELECTRIC GENERATOR

(75) Inventors: Monika Backhaus-Ricoult, Horseheads, NY (US); Peng Chen, Painted Post, NY (US); Mark J Soulliere, Corning, NY (US)

(73) Assignee: Corning Incorporated, Corning, NY (US)

( * ) Notice: Subject to any disclaimer, the term of this patent is extended or adjusted under 35 U.S.C. 154(b) by 75 days.

(21) Appl. No.: 12/878,647

(22) Filed: Sep. 9, 2010

(65) Prior Publication Data

US 2011/0311421 A1  Dec. 22, 2011

Related U.S. Application Data

(60) Provisional application No. 61/356,870, filed on Jun. 21, 2010.

(51) Int. Cl.
- *B01D 53/34* (2006.01)
- *B01D 53/74* (2006.01)
- *B01D 53/94* (2006.01)
- *F01N 3/10* (2006.01)

(52) U.S. Cl. .......... 423/210; 423/213.2; 60/299; 60/300

(58) Field of Classification Search .................... 60/299, 60/300; 423/213.2, 210
See application file for complete search history.

(56) References Cited

U.S. PATENT DOCUMENTS

| | | | | |
|---|---|---|---|---|
| 5,968,456 | A | 10/1999 | Parise | 422/174 |
| 6,986,247 | B1 * | 1/2006 | Parise | 60/284 |
| 7,051,522 | B2 * | 5/2006 | Yang et al. | 60/320 |
| 7,467,513 | B2 * | 12/2008 | Sasaki et al. | 60/320 |
| 7,687,704 | B2 | 3/2010 | Shimoji et al. | 136/205 |
| 2003/0223919 | A1 | 12/2003 | Kwak et al. | 422/174 |
| 2010/0146949 | A1 * | 6/2010 | Stobart et al. | 60/300 |

FOREIGN PATENT DOCUMENTS

| | | |
|---|---|---|
| DE | 102008005334 A1 | 7/2009 |
| EP | 1970971 A1 | 10/2007 |
| GB | 2033659 A | 5/1980 |
| JP | 2005/051952 A | 2/2005 |
| WO | 2009/138412 A1 | 11/2009 |
| WO | 2011/011795 A2 | 1/2011 |

* cited by examiner

*Primary Examiner* — Timothy Vanoy
(74) *Attorney, Agent, or Firm* — Michael W. Russell

(57) ABSTRACT

An after-treatment device for an automotive engine includes a substrate having a thermoelectric generation element disposed in an interior volume thereof. The substrate has a first end, a second end, and an outermost lateral dimension that defines an interior volume, and is configured to flow engine exhaust gas from the first end to the second end such that the flowing exhaust gas is in thermal contact with the thermoelectric generation element.

25 Claims, 16 Drawing Sheets

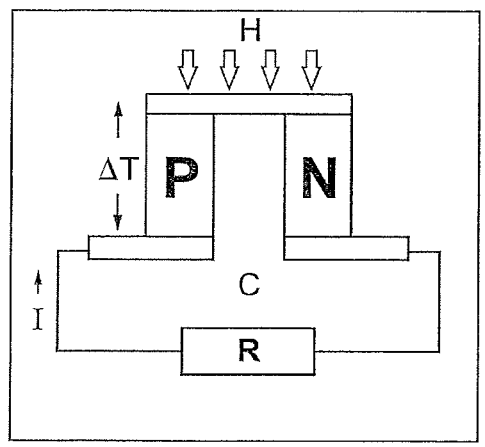
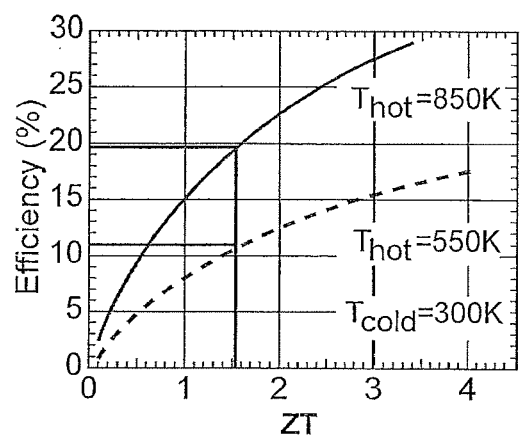
FIG. 5a  FIG. 5b
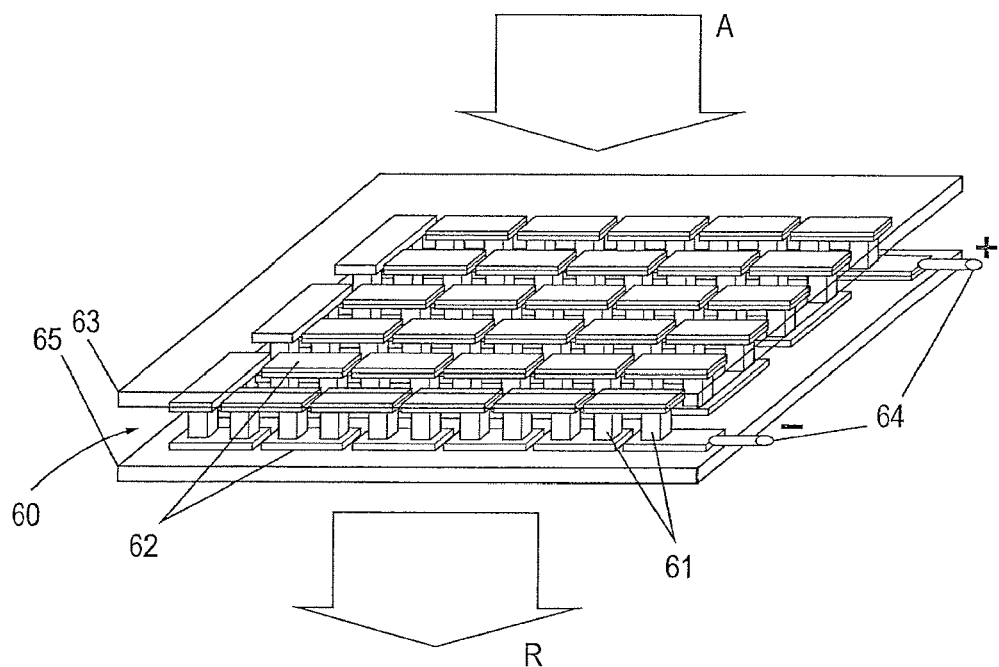
FIG. 6

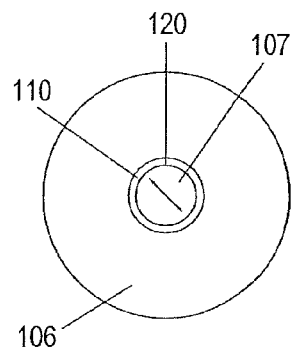 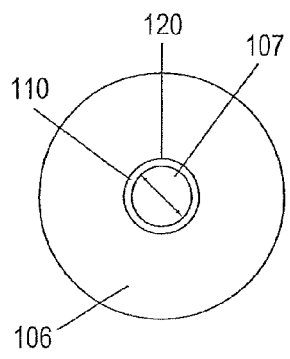 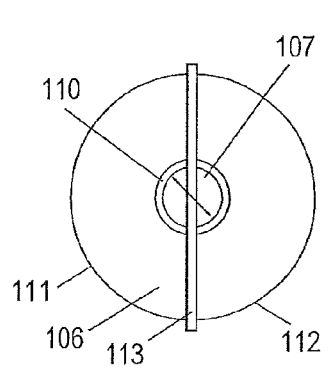
FIG. 11a  FIG. 11b  FIG. 11c
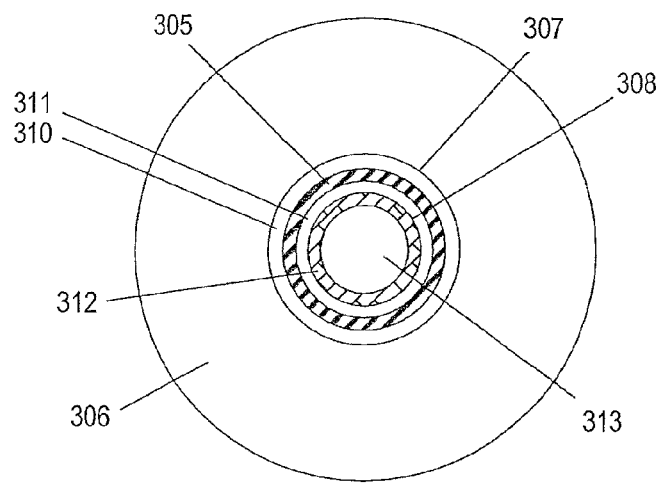
FIG. 12

EXHAUST GAS TREATMENT SYSTEM INCLUDING A THERMOELECTRIC GENERATOR

This application claims the benefit of U.S. Provisional Application No. 61/356,870, filed Jun. 21, 2010, which is incorporated by reference herein in its entirety.

FIELD OF THE DISCLOSURE

The present disclosure relates generally to exhaust gas treatment systems, and particularly to catalytic converter and particulate filter systems that are integrated with a thermoelectric generator.

BACKGROUND

Rising fuel prices and government mandates are driving light and heavy duty vehicle makers to use technologies that reduce both fuel consumption and emissions. It is estimated that only about 33% of the energy from fuel combustion in diesel engines is captured for vehicle operation, while only about 25% of the combustion energy in gasoline engines is used to power the drive train and accessories. In current engine designs, a large fraction of the combustion energy is lost as waste heat. One approach to fuel savings involves recycling waste engine heat, which can be converted into motive or electrical power within the motor vehicle.

One method of waste heat recovery is thermoelectric (TE) generation, whereby direct current (DC) electrical power can be derived from a TE generation element (e.g., an n-type semi-conductor plus a p-type semi-conductor) that is exposed to a thermal gradient. A series connection of TE generation elements forms a TE generation module. Several TE generation modules can be connected in a combination of series and parallel configurations to form a TE generator (TEG). An illustration of an exemplary electrical connection incorporating a TEG is shown in FIG. 1. As illustrated in FIG. 1, a plurality of TE generation modules 10 form a TEG 11, which is electrically connected, for example, to a vehicle's electrical bus 12 and energy storage system (e.g., battery) 13. The current flowing through the connection is depicted, for example, by an arrow and reference label I. Due to the possibility of fluctuations in the current and the voltage of the TEG 11, a DC/DC converter 14 can be used to maintain a line voltage within a range that is compatible with a vehicle's electrical system.

To properly operate, a TEG requires a heat source (i.e. a higher temperature) and a heat sink (i.e., a lower temperature). The temperature gradient created induces a flux of electrical carriers across the TE generation elements. For motor vehicles, the heat source is generally the heat available within the exhaust gas, and the heat sink is generally the coolant circulating within the radiator or an independent cooler system. TEGs have, therefore, been proposed at various locations in a vehicle's exhaust system. Accessible sites may include, for example, the exhaust tailpipe and, particularly for diesel engines, the exhaust gas recirculation (EGR) loop. TEG prototypes have been built, for example, with Bi/Pb-telluride and mounted on a vehicle's tailpipe. Such telluride-based modules have exhibited heat to electrical power conversion efficiencies up to about 10%. EGR loop TEGs are also under development, focusing mainly on skutterudite materials, which for this application may have efficiencies of about 3-10% dependent on the recycled fraction.

There are, however, various factors to consider when designing and implementing a TEG within an exhaust system. Such factors can include the available hot temperatures, the heat flow, the proximity of the heat source and sink to the TEG, the footprint of the TEG in view of the limited space available within an engine compartment or on the underside of a vehicle chassis, and the desire to minimize the mass added to the vehicle. A TEG added to the exhaust gas stream may further undesirably increase the pressure drop or back-pressure on the engine, thereby increasing fuel consumption. Consequently, various challenges may arise in using conventional TEGs in light of space requirements, and the resulting increase in mass and back-pressure.

It may therefore be desirable to integrate a TEG within existing exhaust gas after-treatment devices, such as, for example, catalytic substrates and/or particulate filters, to profit from high available temperatures (e.g., compared with tailpipe locations), high heat flux, reduce the number of components to be carried by the vehicle, and avoid additional back-pressure on the engine. Furthermore, after-treatment device operation windows are generally limited by the high temperatures (e.g., catalytic conversion and filter regeneration operation windows), which may lead to temperature gradients within the devices and thermo-mechanical durability-limiting associated stresses. Therefore, it may also be desirable to integrate a TEG within existing exhaust gas after-treatment devices to widen the operation windows of the after-treatment devices, while also maximizing waste heat recovery in the vehicle.

SUMMARY

In view of the foregoing, economical, efficient and minimally invasive waste heat recovery systems are desirable. The disclosure may solve one or more of the above-mentioned problems and/or may demonstrate one or more of the above-mentioned needs. Other features and/or advantages may become apparent from the description that follows.

In accordance with various exemplary embodiments of the present disclosure, an exhaust gas after-treatment device may comprise a substrate having a first end, a second end, and an outermost lateral dimension defining an interior volume, wherein the substrate is configured to flow exhaust gas through the interior volume from the first end to the second end. The after-treatment device may further comprise at least one thermoelectric generation element disposed at least partially within the interior volume.

In accordance with various additional exemplary embodiments of the present disclosure, a method for treating exhaust gas may comprise flowing exhaust gas through an interior volume of a substrate having a first end, a second end, and an outermost lateral dimension defining the interior volume. The method may further comprise exchanging heat between the flowing exhaust gas and at least one thermoelectric generation element disposed at least partially within the interior volume.

Additional features and advantages of the disclosure will be set forth in the detailed description which follows, and in part will be readily apparent to those skilled in the art from that description or recognized by practicing the present teachings as described herein, including the detailed description which follows, the claims, as well as the appended drawings.

It is to be understood that both the foregoing general description and the following detailed description present exemplary embodiments of the disclosure, and are intended to provide an overview or framework for understanding the nature and character of the present disclosure as it is claimed. The accompanying drawings are included to provide a further understanding of the disclosure, and are incorporated into and

BRIEF DESCRIPTION OF THE DRAWINGS

FIG. 5a is a schematic of a TE generation element;

FIG. 5b is a plot of thermoelectric efficiency versus the Figure of Merit (ZT) for two different hot side temperatures and one fixed cold side temperature;

FIG. 6 is a schematic illustration of an exemplary TE generation module;

FIG. 11a is a schematic illustrating a monolithic substrate having a cavity formed by drilling;

FIG. 11b is a schematic illustrating a monolithic substrate having a cavity formed in situ by extrusion;

FIG. 11c is a schematic illustrating a monolithic substrate having a cavity formed using multiple substrate portions;

FIG. 12 shows an after-treatment device having disc-shaped TEGs and a common cooling channel placed within a circular cavity;

DETAILED DESCRIPTION

According to an exemplary embodiment, an exhaust gas after-treatment system having a thermoelectric generator (TEG) disposed within an after-treatment substrate is disclosed. In accordance with the present disclosure, the substrate, such as, for example, a catalytic substrate or a particulate filter substrate, is adapted to flow exhaust gas from a first end of the substrate to a second end of the substrate within an outermost lateral dimension that defines an interior volume of the substrate. Disposed at least partially within the interior volume is at least one thermoelectric generation element.

By incorporating a thermoelectric (TE) generation element within an interior volume of the substrate, higher hot-side temperatures and hence greater conversion efficiencies may be achieved. In addition, placement of the TE generation element within the interior volume may advantageously promote homogenization of the overall substrate temperature during its operation, particularly with low thermal conductivity substrates, thereby also significantly widening the substrate's operation window.

Figure 1:
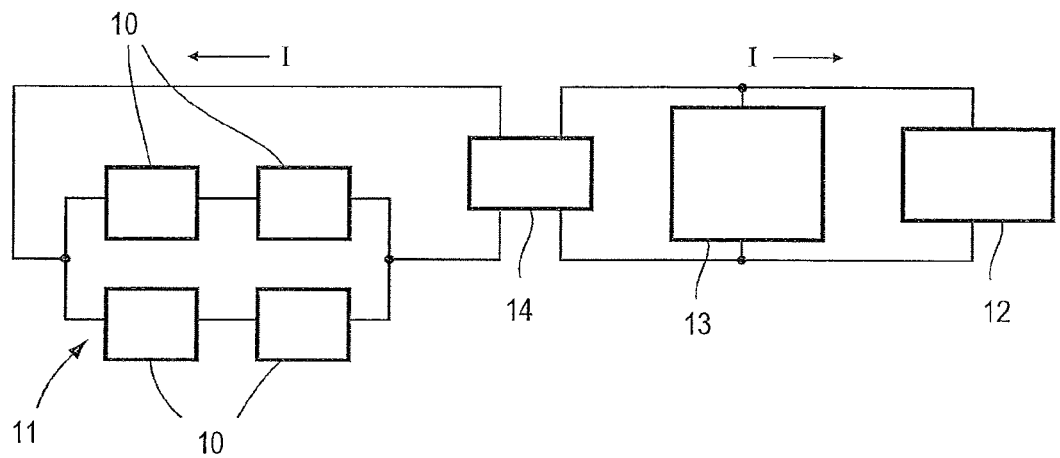
FIG. 1 is a schematic of an exemplary electrical connection for a TEG within a motor vehicle.
Figure 2:
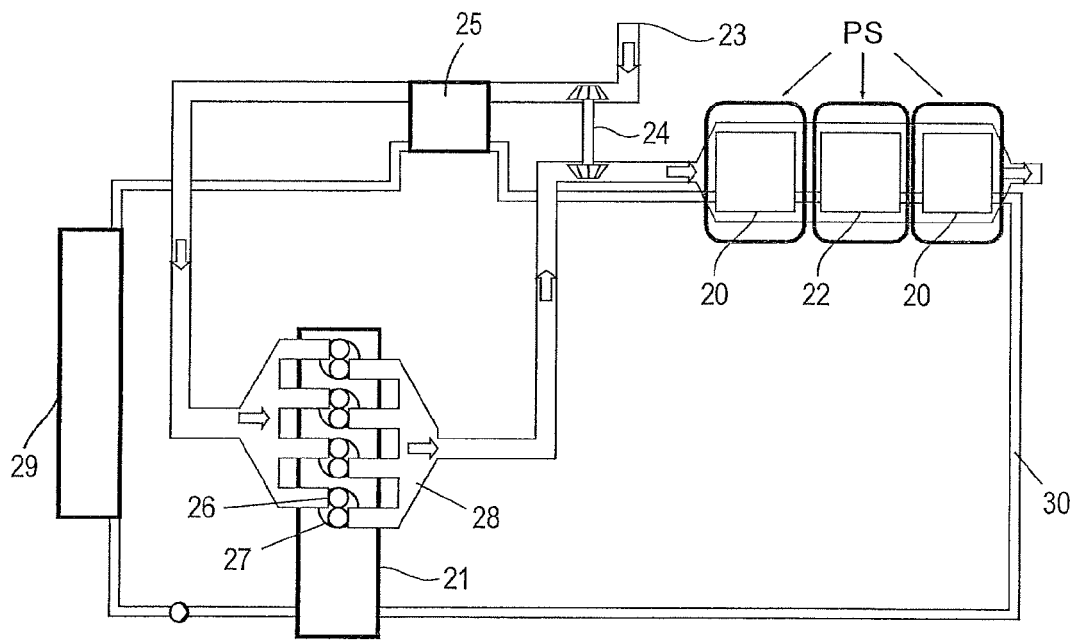
FIG. 2 illustrates possible TEG locations relative to after-treatment devices of a gasoline engine.

In a gasoline engine, for example, exhaust gas can pass through one or more three-way catalyst (TWC) substrates. As illustrated schematically in FIG. 2, typical gasoline after-treatment systems include a TWC substrate 20 that is close-coupled to an engine 21, along with another underbody TWC substrate 20 further downstream. As shown in FIG. 2, in various exemplary embodiments, a gasoline particulate filter (GPF) substrate 22 may also be provided. As those of ordinary skill in the art would understand, during operation of the engine 21, air enters via an air intake 23, is compressed by a turbocharger 24, cooled by an inter-cooler 25, and passes through intake valves 26 into the engine's 21 cylinders. After fuel is added and ignited, exhaust gas emerges from exhaust valves 27, is combined in an exhaust manifold 28, spins the turbocharger 24 (if present), and passes through the TWCs 20 and GPF 22.

The thermal mass of the TWC substrates 20 and/or the GPF substrate 22 allows for heat storage (i.e., the heat source) from exhaust gas passing through the after-treatment system, and engine coolant may be, for example, routed through the after-treatment system from a radiator 29 via a coolant pipe 30 to act as the heat sink. Accordingly, in the gasoline engine, as illustrated in FIG. 2, there are various potential sites (PS) for integrating a TEG within an after-treatment substrate.

Figure 3:
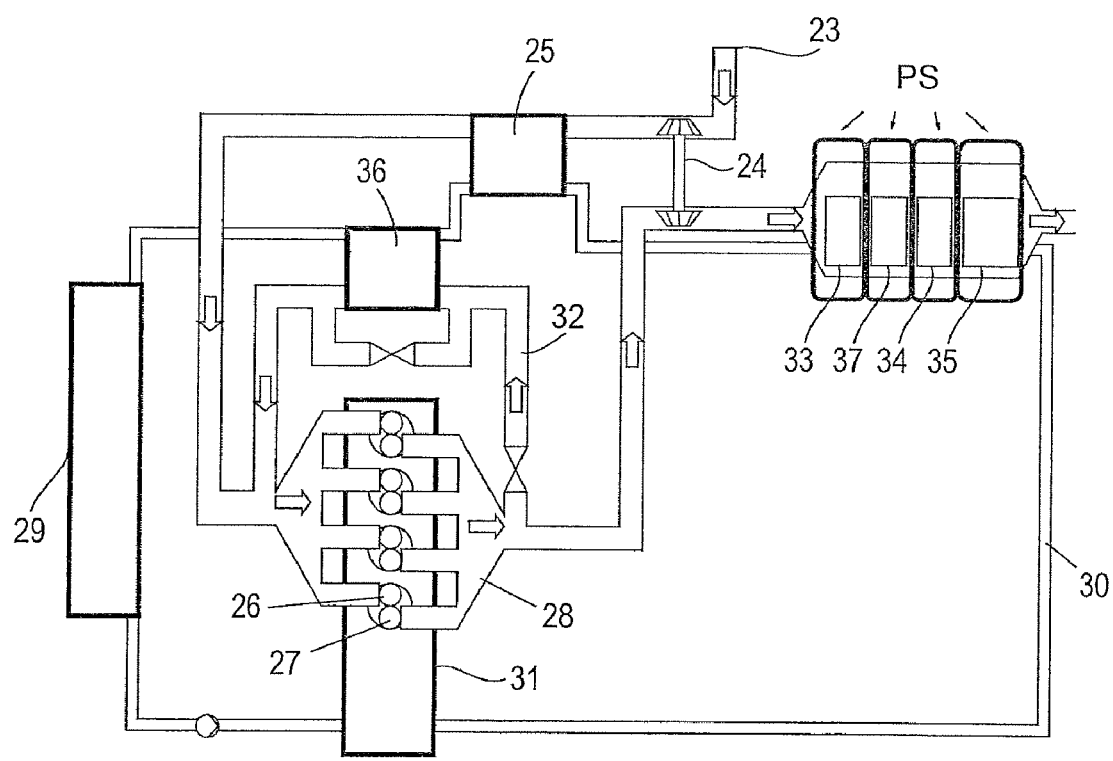
FIG. 3 illustrates possible TEG locations relative to after-treatment devices of a diesel engine.

During operation of a diesel engine 31, as shown schematically in FIG. 3, exhaust gas that emerges from the exhaust manifold 28 has a second possible return path to the intake valves 26, i.e., via an exhaust gas recirculation loop (EGR) 32, which passes through an EGR cooler 36. As with the gasoline engine 21, however, the remaining exhaust gas passes through a series of after-treatment elements. Catalyst substrates may include, for example, as shown in FIG. 3, a diesel oxidation catalyst (DOC) substrate 33, a selective catalytic reduction (SCR) catalyst substrate 34, and an ammonia slip catalyst substrate 35. In various exemplary embodiments, a diesel vehicle may also substitute a lean NOx trap (LNT) for the SCR and ammonia slip catalyst substrates. As those of ordinary skill in the art would understand, catalyst substrates are often composed of a cellular ceramic or metal substrate, which is coated with the catalytic material.

In various exemplary embodiments, in addition to catalyst substrates, as shown in FIG. 3, the diesel engine 31 may also include a diesel particulate filter (DPF) substrate 37. As those of ordinary skill in the art would further understand, the DPF substrate 37 can be made, for example, using various porous cellular ceramic substrates whose ends are plugged in a checkerboard fashion, or by using a partial flow filter made, for example, of corrugated metal sheets.

As above, the thermal mass of the catalytic substrates 33, 34 and 35 and/or the DPF substrate 37 may therefore act as heat storage (i.e., the heat source) for exhaust gas passing through the after-treatment system. And engine coolant may be, for example, routed through the after-treatment system from a radiator 29 via a coolant pipe 30 to act as the heat sink. Accordingly, in the diesel engine, as illustrated in FIG. 3, there are various potential sites (PS) for integrating a TEG within an after-treatment substrate.

As used herein, a "substrate" or an "after-treatment substrate" includes catalytic substrates and particulate filter substrates that are intended to remove pollutants from engine exhaust gas. Substrates may include, for example, a porous body made from various metal and ceramic materials, including, but not limited to, cordierite, silicon carbide (SiC), silicon nitride, aluminum titanate (AT), eucryptite, mullite, calcium aluminate, zirconium phosphate and spodumene. A "catalyst substrate" may include, for example, a porous body, such as a TWC, DOC or SCR, which is infiltrated with a catalyst that assists a chemical reaction to reduce or eliminate the concentration of various pollutants within the exhaust gas (e.g., monoxide, nitrogen oxides, sulfur oxide, and hydrocarbons). A "particulate filter substrate" may include, for example, a porous body, such as a GPF or DPF substrate, which traps and therefore reduces particulate matter within the exhaust stream (e.g., soot and ash).

The substrates of the present disclosure can have any shape or geometry suitable for a particular application, as well as a variety of configurations and designs, including, but not limited to, a flow-through structure, a wall-flow structure, or any combination thereof (e.g., a partial-flow structure). Exemplary flow-through structures include, for example, any structure comprising channels or porous networks or other passages that are open at both ends and permit the flow of exhaust gas through the passages from one end to an opposite end. Exemplary wall-flow structures include, for example, any structure comprising channels or porous networks or other passages with individual passages open and plugged at opposite ends of the structure, thereby enhancing gas flow through the channel walls as the exhaust gas flows from one end to the other. Exemplary partial-flow structures include, for example, any structure that is partially flow-through and partially wall-flow. In various exemplary embodiments, the substrates, including those substrate structures described above, may be monolithic structures. Various exemplary embodiments of the present teachings, contemplate utilizing the cellular geometry of a honeycomb configuration due to its high surface area per unit volume for deposition of soot and ash. Those having ordinary skill in the art will understand that the cross-section of the cells of a honeycomb structure may have virtually any shape and are not limited to square or hexagonal. Similarly, a honeycomb structure may be configured as either a flow-through structure, a wall-flow structure, or a partial-flow structure.

Figure 4A:
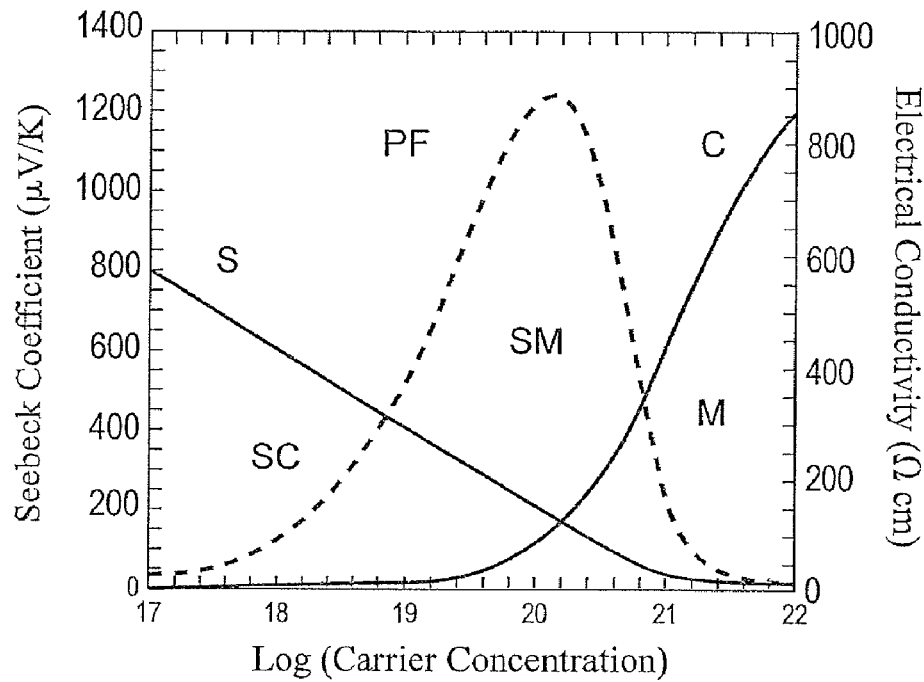
FIGS. 4a and 4b show the interrelationship among various TE material properties.
Figure 4B:
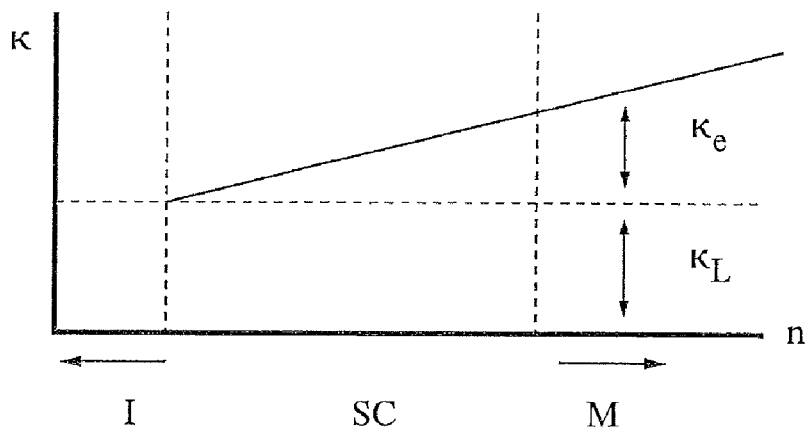

To recover electricity from waste heat, such as exhaust heat passing through an after-treatment system as shown and described above with reference to FIGS. 2 and 3, the present disclosure contemplates integrating various high-temperature TE materials within after-treatment substrates. As those of ordinary skill in the art would understand, suitable TE materials generally produce a large thermopower when exposed to a temperature gradient. Suitable materials, for example, usually exhibit a strong dependency of their carrier concentration on temperature, have high carrier mobility, and low thermal conductivity. As those of ordinary skill would further understand, suitable materials, which may recover a large fraction of heat energy, generally have a large Figure of Merit ZT, defined as $ZT = T*S^2*(\sigma/\kappa)$, wherein T is temperature (in Kelvin), S is the Seebeck coefficient or thermopower (in V/m), $\sigma$ is the electric conductivity (in Siemens/m), and $\kappa$ is the thermal conductivity (in W/mK). As would be also understood, the Seebeck voltage describes the potential difference that is established across a material exposed to a temperature gradient; and the Seebeck coefficient is obtained by extrapolating the Seebeck voltage to a vanishing temperature gradient. Depending on the majority carrier type in the material, the Seebeck coefficient can be positive or negative. These relationships are illustrated in FIGS. 4a and 4b for various materials (i.e., insulating materials I, semiconductor materials SC, semimetal or heavily doped semiconductor materials SM, and metal materials M), showing the relationship of the Seebeck coefficient ($\alpha$) S, Power Factor ($\alpha^2/\rho = \alpha^2\sigma$) PF, and Conductivity ($\sigma = 1/\rho$) C.

As illustrated with reference to FIG. 5a, an exemplary TE generation element (e.g., that comprises interconnected n-type and p-type semi-conductors) is the building block of a TEG. A TE generation couple is built, for example, of an assembly of interconnected p-legs and n-legs composed of p-type and n-type TE materials (e.g., n-type and p-type semiconductors). As shown in FIG. 5a, when the TE generation couple is exposed to a heat source H and a heat sink C, which creates a temperature gradient $\Delta T$ across the couple, a current I flows clockwise around the circuit. A plot of the efficiency of converting heat into electricity as a function of the Figure of Merit ZT is illustrated in FIG. 5b. As shown in FIG. 5b, for a material having a ZT value of about 1.5, the conversion efficiency is about 10% for a temperature gradient of about 200K (i.e., $T_{hot}=500K-T_{cold}=300K$) and about 20% for a temperature gradient of about 550K (i.e., $T_{hot}=850K-T_{cold}=300K$).

As those of ordinary skill in the art would also understand, various shapes and arrangements of TE legs have been proposed for integrating TE materials and components into a TEG. For exemplary purposes only, one exemplary TE generation module is illustrated in FIG. 6. As shown in FIG. 6, a TE module 60 may be built between plates 63 and 65, respectively located on a hot side A and cold side R of the module 60 (e.g., as respectively shown by arrows A and R, heat is absorbed through the top surface of plate 63 and rejected through the bottom surface of plate 65). Plates 63 and 65 thereby act respectively as the heat source and heat sink for the module 60. Alternating p-legs and n-legs 61 are interconnected in series by metal interconnects 62 on both the hot and cold sides of the module 60, so that the total voltage of the module 60 is made available at end leads 64. As those of ordinary skill in the art would understand, instead of the simple plates 63 and 65 shown in FIG. 6, a TEG will generally contain efficient heat exchangers that guarantee efficient heat exchange between the hot and cold sources. Those of ordinary skill in art would understand, however, that various TEG designs and/or configurations are considered by the present disclosure and claims.

As above, in various exemplary embodiments, a substrate (e.g., a catalytic substrate or particulate filter substrate) may comprise a variety of materials, including materials having a relatively high thermal conductivity and/or materials having a relatively low thermal conductivity. In various embodiments, for example, a substrate may comprise a metallic material having a thermal conductivity in the range of about 20 W/mK to about 25 W/mK. Whereas in various additional embodiments, a substrate may comprise a ceramic material having a thermal conductivity in the range of about 0.5 W/mK to about 20 W/mK. In various embodiments, the substrate may also include a honeycomb structure, wherein the overall thermal conductivity can be further reduced by increasing the porosity and decreasing the wall thickness.

Figure 7:
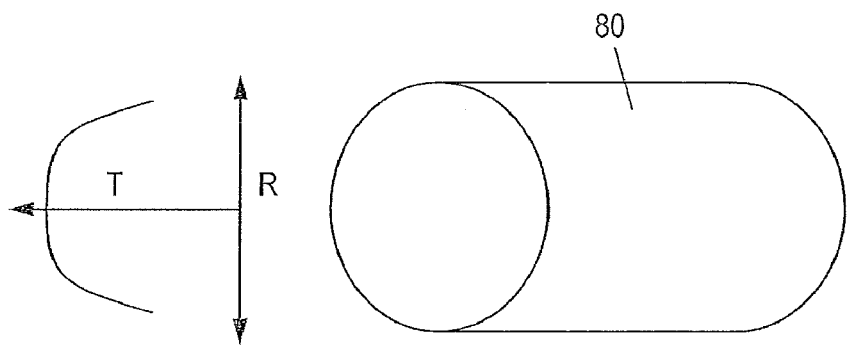
FIG. 7 is a schematic showing the temperature distribution (T) across the transverse direction (R) of a substrate.

As would be understood by those of ordinary skill in the art, the temperature distribution within a substrate (e.g., a catalytic substrate or particulate filter substrate) is a function of a number of parameters. For catalytic substrates, the substrate temperature (and temperature profile) may be a function of the type of engine, the type of fuel, the configuration of the after-treatment system, and various other factors. As visualized in the temperature distribution profile shown in FIG. 7 adjacent the substrate 80, in a gasoline engine, for example, the substrate 80 may be several hundred degrees cooler at the periphery compared to the core (with T indicating temperature and R indicating transverse distance in the temperature distribution profile). For efficient operation of the catalytic substrate, desired operational parameters include a substantially homogeneous temperature distribution across the substrate, flow homogeneity, and fast light off. The transverse (e.g., radial) for the substrate configuration of FIG. 7) temperature gradient depicted in FIG. 7 may therefore result in a less efficient use of the catalyst in the outer, colder periphery of the substrate 80 in the case of a catalytic substrate, or lead to overheating of the catalyst and substrate compared to the needed operation temperature.

In an un-catalyzed particulate filter substrate, such as for example a DPF substrate, where the temperature is typically a function of the location of the filter within the exhaust system (i.e., a standard configuration versus a close-coupled configuration), the average substrate temperature is typically less than the average catalytic substrate temperature. A DPF substrate, for example, operates in two principal regimes, a regular operating regime (i.e., a base temperature for either catalyzed or un-catalyzed filters) and a regeneration regime. During filter regeneration, temperatures may peak to considerable values, wherein a filter's core temperature can be several hundred degrees higher than the temperature at the periphery, thereby also resulting in a strong radial temperature gradient. Such temperature gradients make it difficult for substrates (e.g., catalytic substrates and particulate filter substrates) to remain within an acceptable operation window.

Transverse temperature gradients in both catalytic substrates and particulate filter substrates may, therefore, limit the operational window of low thermal conductivity filters. One approach to decreasing the temperature gradient is to use higher thermal conductivity materials for the substrate. In accordance with the present disclosure, the temperature gradient in a substrate may also be decreased by integrating at least one TE generation element within the substrate, thereby extending the substrate's operation window and providing waste heat recovery within the vehicle.

Figure 8A:
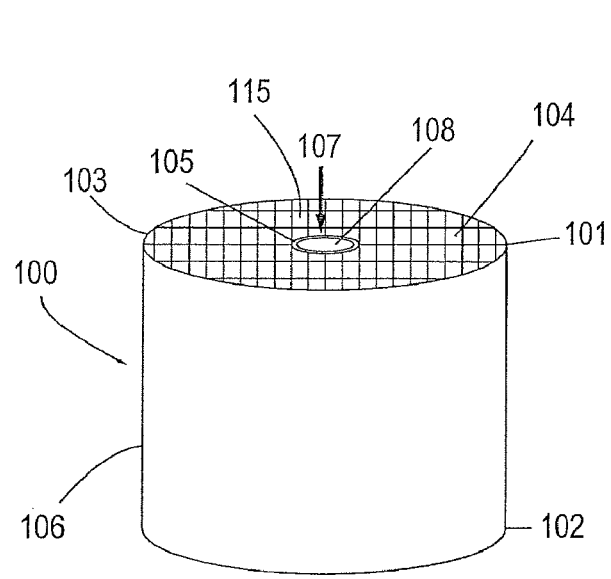
FIG. 8a is a schematic illustration of an after-treatment device having a TEG disposed within a central core.

As illustrated in FIG. 8a, in accordance with various exemplary embodiments of the present disclosure, an after-treatment device 100 may comprise a substrate 106 having a first end 101, a second end 102, and an outermost lateral dimension 103, defining an interior volume 104. As explained above, when placed within an after-treatment system, the substrate 106 is configured to flow exhaust gas through the interior volume 104 from the first end 101 to the second end 102. In various embodiments, for example, the substrate is a structure comprising a plurality of channels 115 that permit the flow of exhaust gas through the channels 115 from the first end 101 to the second end 102. In an exemplary embodiment, the substrate comprising channels may have a honeycomb configuration; however, those ordinarily skilled in the art would recognize that the channels may have a variety of arrangements and configurations (e.g., cross-sections) without departing from the scope of the disclosure. For ease of reference only, channels are not shown in FIGS. 9-18 and 20-25.

As used herein the term "outermost lateral dimension" refers to an outer peripheral boundary surface (portions of which can be imaginary) defined by the largest distance between the center of the substrate and the skin of the substrate. By way of example, for a substrate having a circular cross-section, the "outermost lateral dimension" is defined by the radius of the substrate. Accordingly, as shown, for example, with reference to FIG. 9, if a substrate 200 is not perfectly circular (i.e., has notches 201 or other indentations, slots, or openings formed in the peripheral surface), the outermost lateral dimension 203 is defined by the convex shadow enveloping the substrate 200 defined by the largest radius r between the center 202 of the substrate 200 and the skin 204 of the substrate 200 (including the concave portions 205 introduced by the notches 201). Thus, in the exemplary embodiment of FIG. 9, portions of the outermost lateral dimension coincide with the peripheral surface of the substrate 200 (i.e., surfaces excluding notches) and other portions include imaginary surface portions (i.e., surfaces including notches 201).

As used herein the term "interior volume" refers to the volume bounded by the outermost later dimension. With reference again to FIG. 9, the interior volume is the volume defined by the outermost lateral dimension 203, which includes both the volume of the substrate 200 and the volume of the notches 201 (defined by the concave portions 205).

Figure 8B:
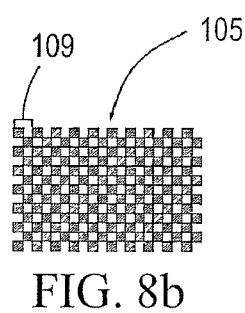
FIGS. 8b and 8c illustrate exemplary embodiments of TE generation element patterns.
Figure 8C:
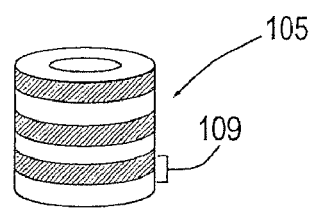
Figure 9:
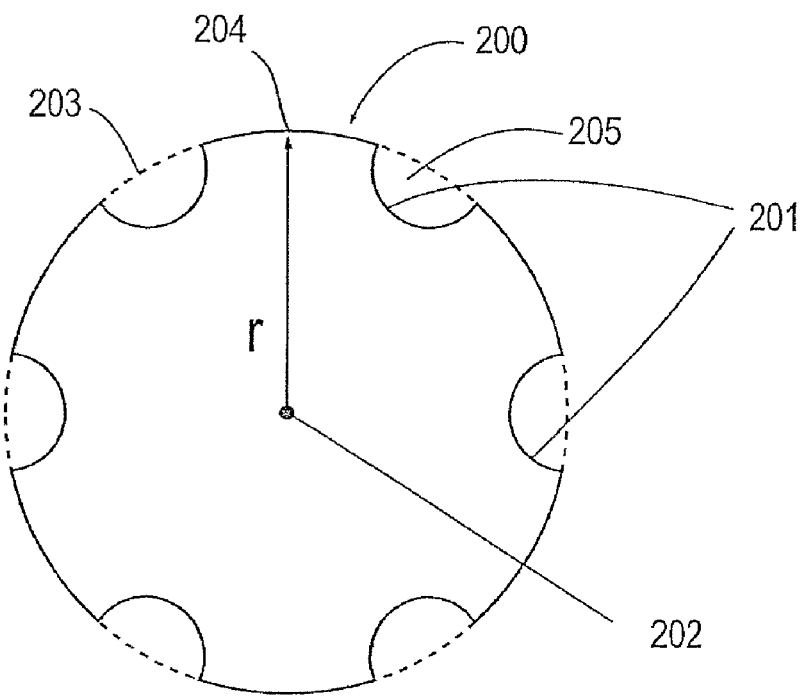
FIG. 9 illustrates an exemplary outermost lateral dimension of a substrate.

In accordance with the present disclosure, at least one thermoelectric (TE) generation element is disposed at least partially within the interior volume 104. As shown in FIGS. 8b and 8c, a TEG 105 may comprise different patterns of TE generation elements 109 including, for example, a checkerboard pattern with alternating n-type and p-type legs (FIG. 8b), a stack of n-type and p-type disks (FIG. 8c), radially-extending n-type and p-type fins, or combinations thereof. Those of ordinary skill in the art would understand, however, that various patterns of TE generation elements 109 can be used without departing from the present disclosure or claims. As those of ordinary skill in the art would understand, the n-legs and p-legs are separated from each other. Suitable separating layers may be made, for example, from a low thermal conductivity, low electrical conductivity material, such as, for example, a ceramic or glass-ceramic foam, coating or interlayer.

In various exemplary embodiments, TE generation elements 109 are in direct physical contact with the substrate 106. In various additional embodiments, the TE generation elements 109 may be in thermal contact with the substrate 106 via a thermal transfer medium. As those of ordinary skill in the art would understand, the thermal transfer medium can be formed from any type of conforming, thermally conductive substance. The thermal transfer medium may serve, for example, to conform to the surfaces of the TE generation elements 109 and the substrate 106 to effectively enhance thermal transfer from the heat source or cooling source to the TE generation module. Those of ordinary skill in the art would understand that suitable thermal transfer materials may comprise materials having a low electrical conductivity and a high thermal conductivity, including, for example, metallic foams, nets, and metal-ceramics.

Figure 10:
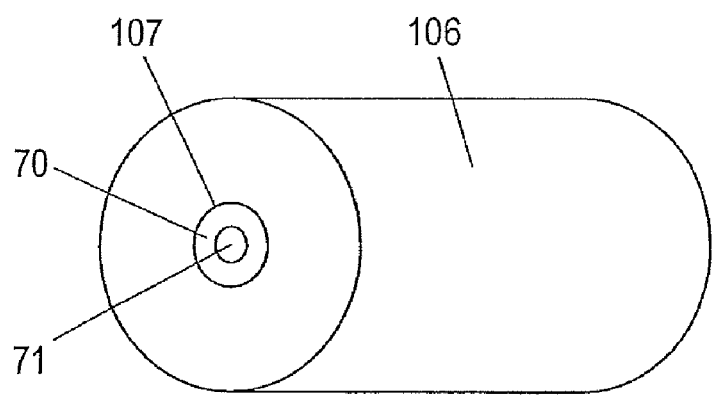
FIG. 10 is a schematic of an after-treatment device having a TEG with a cooling circuit disposed along a central core of the substrate.

As noted previously with respect to FIG. 7, a substrate may demonstrate a higher temperature in its core than at its periphery. Such radial transverse thermal gradients may introduce stress within a substrate and limit its thermo-mechanical durability and operation window. Accordingly, in various exemplary embodiments, the temperature gradients across the substrate and hence the thermally-generated stress can be reduced by locating one or more TE generation elements or coolant flow in the hottest region of the substrate, i.e., along the core. This geometry, where the TE generation elements 109 are proximate the substrate 106 and the coolant flow runs along a central axis of the substrate 106 via an integrated cooling circuit 108 in thermal contact with the TE generation elements 109, is illustrated in FIGS. 8a and 10. As illustrated in FIG. 10, for example, the substrate 106 may comprise a central cavity 107 having a volume 70 for the TE generation elements 109 (e.g., comprising the TEG 105 as shown in FIGS. 8a, 8b and 8c) with a volume 71 for the integrated cooling circuit 108 (shown in FIG. 8a). In such a configuration, the cooling effect of the cooling circuit 108 (i.e., the heat sink) limits the maximum core temperatures and helps to decrease the temperature gradients across the substrate. Accordingly, the thermo-mechanical reliability of the substrate is strongly enhanced and its operation window is enlarged, thereby allowing for higher soot mass in a filter substrate and/or higher temperature spikes in a catalytic substrate. In various embodiments, the TE generation elements 109 can, therefore, be configured to cool the substrate 106. In various embodiments, for example, coolant flow adjacent to the TE generation elements 109 can be used to control the TEG 105 in response to the temperature of the substrate 106. For example, in various embodiments, the after-treatment device 100 may further comprise at least one temperature sensor that is configured to measure a temperature of the interior volume 104, and the coolant flow can be adjusted (increased or decreased) in response to the measured temperature. In various embodiments, for example, the coolant flow can be adjusted in response to a regeneration event associated with a particulate filter substrate. In various additional embodiments, the coolant flow in the catalytic converter can be adjusted to preserve a threshold temperature for the catalytic activity. As those of ordinary skill in the art would understand, in various further embodiments, to auto-regulate the amount of heat pulled from the substrate, a TE material with a steep, step function in its ZT performance with temperature can optionally be applied to allow for a threshold response.

Locating the heat sink (i.e., the integrated cooling circuit 108) at or near the hottest zone of the substrate can also transfer heat to warm up the engine coolant during cold starts. This can facilitate faster heating of, for example, the passenger cabin in a motor vehicle, as well as the engine block and engine oil, which can reduce engine friction. Accordingly, in various additional embodiments, the TE generation elements 109 can be configured to heat the substrate 106.

As illustrated in FIG. 8a, a cavity 107 (e.g., a conduit that is open at both ends) may be formed within a central core (within the interior volume 104) of the substrate 106, and the TEG 105 and the integrated cooling circuit 108 may be disposed within the cavity 107. Thus, the TEG 105 is positioned between a heat source (the substrate 106) and a heat sink (the cooling circuit 108). As would be understood by those of ordinary skill in the art, depending on a particular application and substrate geometry, the TEG 105 and the integrated cooling circuit 108 may have various configurations within the cavity 107. Accordingly, in accordance with the present disclosure, various substrate geometries, TEG geometries, and exhaust after-treatment system configurations are disclosed below.

As would be further understood by those of ordinary skill in the art, a number of approaches can be used to form the longitudinal cavity 107 within the substrate 106. In various embodiments, as illustrated in FIG. 11a, the substrate 106 can be formed and the cavity 107 can be drilled from a previously-formed substrate 106. A drilled cavity 107 could, however, leave a roughened inner surface 120 of the cavity 107. Thus, to improve thermal contact between the substrate 106 and a TEG, an electrically insulating thermal transfer medium layer 110 can be implemented on the inner surface 120 of the drilled cavity 107. As would be understood by those of ordinary skill, the electrically insulating layer 110 may be formed by various methods, including, but not limited to, dip coating, spray coating or direct fitting of a pre-formed layer.

In various additional embodiments, as illustrated in FIG. 11b, the cavity 107 can be formed in situ during formation of the substrate 106, such as via extrusion where the extrusion die is modified to form the cavity 107 when the substrate 106 is formed. As with the drilling embodiment of FIG. 11a, an electrically insulating thermal transfer medium layer 110 may optionally be formed on an inner surface 120 of the cavity 107.

As illustrated in FIG. 11c, in various further embodiments, a substrate assembly 106 having a central cavity 107 can be fashioned by forming, such as by extrusion for example, two or more separate substrate components 111 and 112 that when assembled (e.g., via closing an air gap 113 shown for illustrative purposes in FIG. 11c) produce the desired form factor.

A cavity can have any suitable geometry and/or cross-sectional shape, including circular (as shown in FIGS. 8a, 10, and 11), square, rectangular, oval, etc. FIG. 12, for example, illustrates a substrate 306 having a circular cavity 307 with a disc-shaped TEG 305 (see FIG. 8c) disposed therein. The disc-shaped p-legs and n-legs are separated by an electrically and thermally insulating layer. An electrically insulating heat transfer layer 310 (i.e., a thermal transfer medium) separates the TEG 305 from the body of the substrate 306. An optional electrically insulating layer 311 separates the TEG 305 from a cooling medium, such as, for example, an integrated cooling circuit 308 (i.e., a common cooling channel) defined by a pipe 312 configured to flow a coolant 313 therethrough. As above, a disc-shaped TEG 305 can be used, particularly with substrates having circular cavities, to improve the thermal contact between the TE generation elements (not shown) and the substrate 306.

As also illustrated in FIG. 12, cross-hatching is used throughout the figures for ease of differentiating the various elements shown. Those of ordinary skill in the art would understand that the cross-hatching is for delineation purposes only and not intended to limit the disclosure or claims in any manner.

Figure 13:
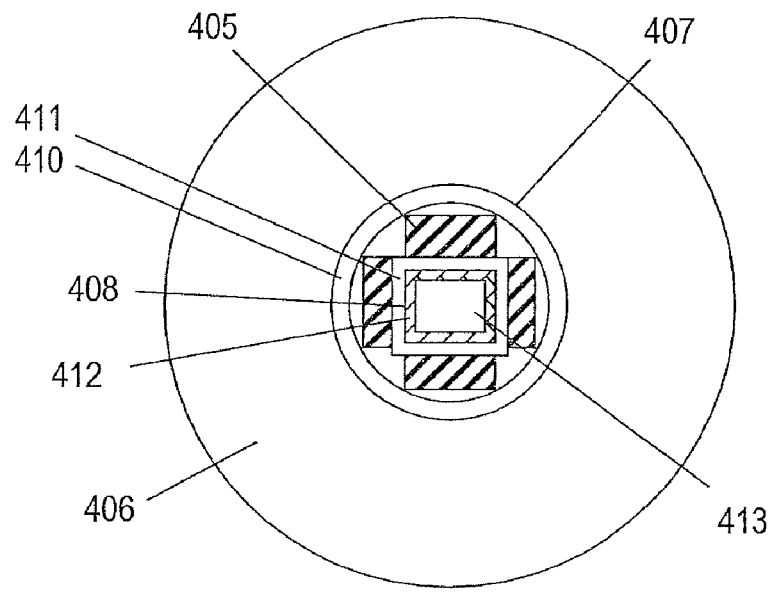
FIG. 13 shows an after-treatment device having plural TEGs and a common cooling channel placed within a circular cavity.

A substrate 406 having a central, circular cavity 407 comprising multiple rectangular TEGs 405 is illustrated in FIG. 13. Within the cavity 407, an electrically insulating heat transfer layer 410 separates the TEGs 405 from the body of the substrate 406, while an optional electrically insulating layer 411 separates the TEGs 405 from the cooling medium, such as, for example, an integrated cooling circuit 408 defined by a rectangular pipe 412 configured to flow a coolant 413 therethrough.

Figure 14:
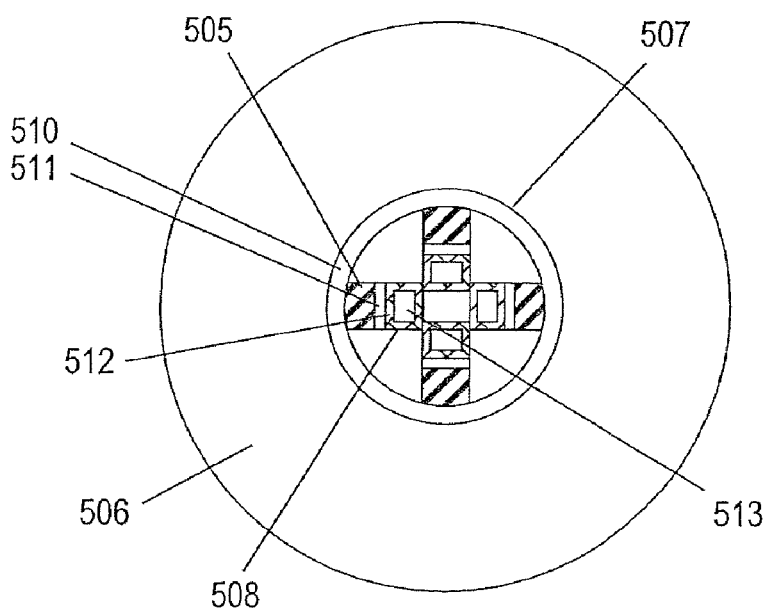
FIG. 14 shows an after-treatment device having plural TEGs with respective cooling channels placed within a circular cavity.

As illustrated in FIG. 14, in an alternate embodiment, a substrate 506 having a central, circular cavity 507 may comprise multiple (4 being depicted in the exemplary embodiment of FIG. 14) rectangular TEGs 505, each being in thermal contact with a respective cooling circuit 508 (i.e., cooling channel) defined by a rectangular pipe 512 configured to flow coolant 513 therethrough. An electrically insulating heat transfer layer 510 separates each TEG 505 from the body of the substrate 506, while an optional electrically insulating layer 511 separates each TEG 505 from a cooling circuit 508. In the embodiment of FIG. 14, for example, each TEG 505 is oriented to have improved thermal contact with the electrically insulating heat transfer layer 510, thereby improving thermal contact with the substrate 506.

Figure 15:
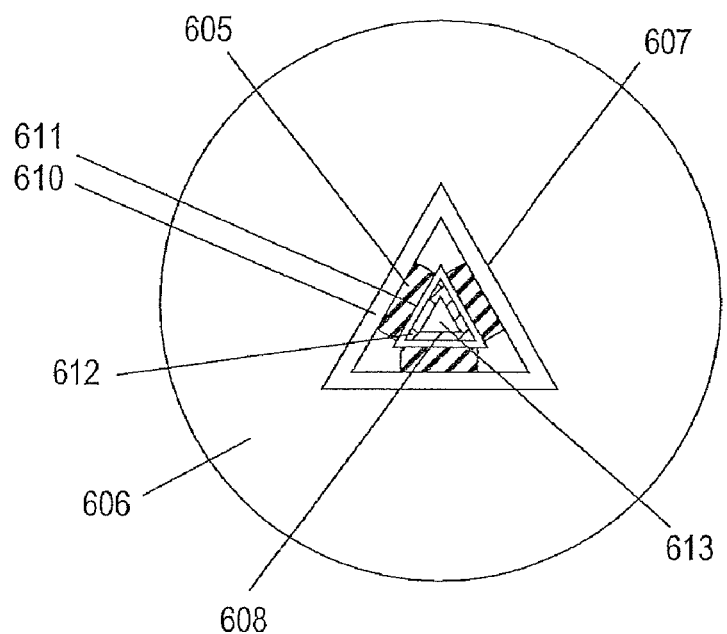
FIG. 15 shows an after-treatment device having plural TEGs and a common cooling channel placed within a triangular cavity.
Figure 16:
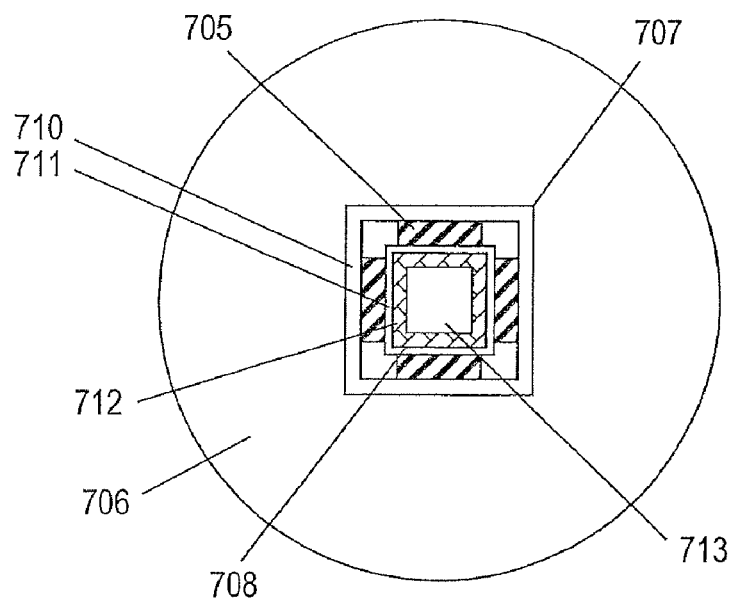
FIG. 16 shows an after-treatment device having plural TEGs and a common cooling channel placed within a square cavity.
Figure 17:
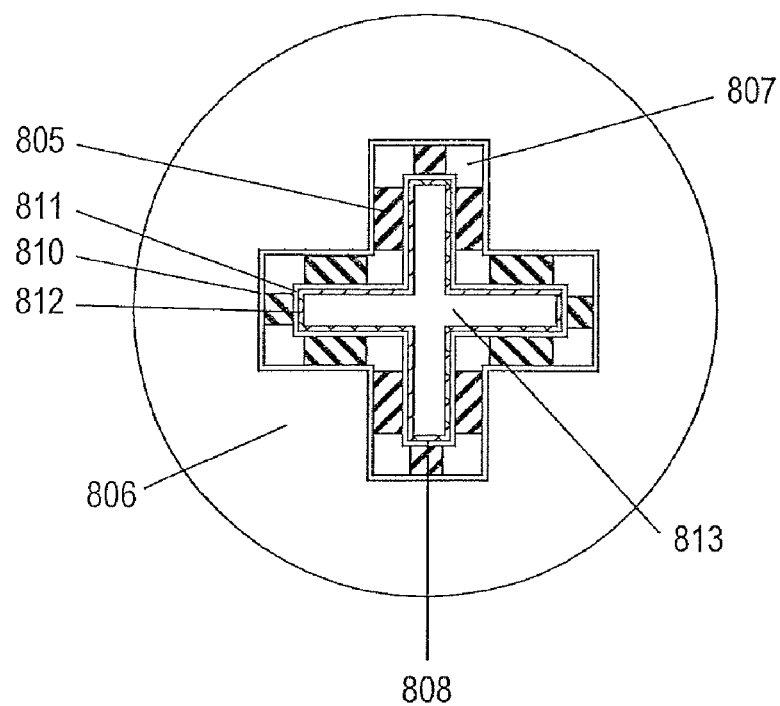
FIG. 17 shows an after-treatment device having plural TEGs and a common cooling channel placed within a cross-shaped cavity.

As shown in FIGS. 15-17, in various exemplary embodiments, a polygonal cavity having $i_{element}$ sides, where $i_{element}$ is the number of transverse TE generation elements disposed within the cavity, may be used instead of a circular cavity. Furthermore, in embodiments having a polygonal cavity, the length of the sides of the polygon can be equal or unequal. For instance, the length of the sides of the polygon can be equal if the TEGs themselves all have the same transverse dimension. If the TEGs, however, have varying transverse dimensions or if the coefficient of thermal expansion (CTE) of the substrate is anisotropic (i.e., has properties that differ in the x and y directions), the cavity dimensions may be adjusted to allow for longer TEGs in one preferred dimension.

FIG. 15, for example, illustrates a substrate 606 having a triangular cavity 607. As shown in FIG. 15, three TEGs 605 are fitted into the cavity 607. As above, the TEGs 605 are separated from the substrate 606 by an electrically insulating heat transfer layer 610, and are separated from a central cooling circuit 608 by an optional electrically insulating layer 611. The central cooling circuit 608 is defined by a triangular pipe 612 configured to flow coolant 613 therethrough.

FIG. 16 illustrates a substrate 706 having a square cavity 707. As shown in FIG. 16, four TEGs 705 are fitted into the cavity 707. The TEGs 705 are separated from the substrate 706 by an electrically insulating heat transfer layer 710, and are separated from a central cooling circuit 708 by an optional electrically insulating layer 711. The central cooling circuit 708 is defined by a square pipe 712 configured to flow coolant 713 therethrough.

FIG. 17 illustrates a substrate 806 having a cross-shaped cavity 807. As shown in FIG. 17, twelve TEGs 805 are fitted into the cavity 807. The TEGs 805 are separated from the substrate 806 by an electrically insulating heat transfer layer 810, and are separated from a central cooling circuit 808 by an optional electrically insulating layer 811. The central cooling circuit 808 is defined by a cross-shaped pipe 812 configured to flow coolant 813 therethrough. As would be understood by those of ordinary skill in the art, such a multi-sided structure can be used to increase the available contact surface area between the TEGs 805 and the substrate 806.

Figure 18:
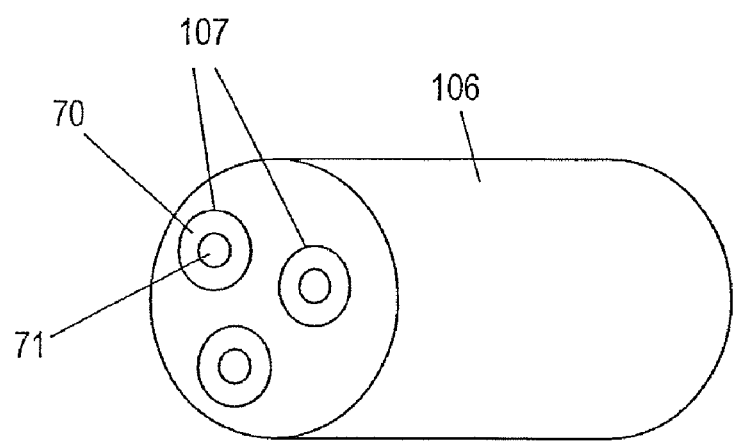
FIG. 18 shows an after-treatment device having a plurality of circular cavities with a TEG placed in each cavity.

In various additional exemplary embodiments, as illustrated in FIG. 18 multiple cavities 107 may be formed within the substrate 106. As shown in FIG. 18, for example, three circular cavities 107 may be formed within the substrate 106, each cavity 107 having a volume 70 for TE generation elements (e.g., comprising TEGS) and a volume 71 which may contain an integrated cooling circuit. Those of ordinary skill in the art would understand, however, that the embodiment of FIG. 18 is exemplary only and that a substrate can have various numbers and/or configuration of cavities without departing from the scope of the present disclosure and claims. It would be appreciated, for example, that when multiple cavities are used, various cavity shapes are also contemplated, and that a shape of one cavity may be the same or different from the shape of a second cavity. Accordingly, in both single cavity and multiple cavity embodiments, a skilled artisan would be able determine the appropriate size and position of each cavity. For instance, cavities may be positioned symmetrically or asymmetrically within a substrate in order to balance CTE asymmetries. Those of ordinary skill in the art would understand, however, that in all of the foregoing embodiments, the TE generation elements and coolant channels are located within the interior volume of the substrate (defined by the outermost lateral dimension of the substrate) and hence interior to a housing or exhaust gas container (i.e., a can) that may contain the substrate. Those of ordinary skill in the art would additionally understand that the TE generation elements and/or coolant channels may extend along the entire length of the interior volume of the substrate and/or only partially along the length of the interior volume. Furthermore, multiple TE generation elements may be placed within the interior volume.

Figure 19A:
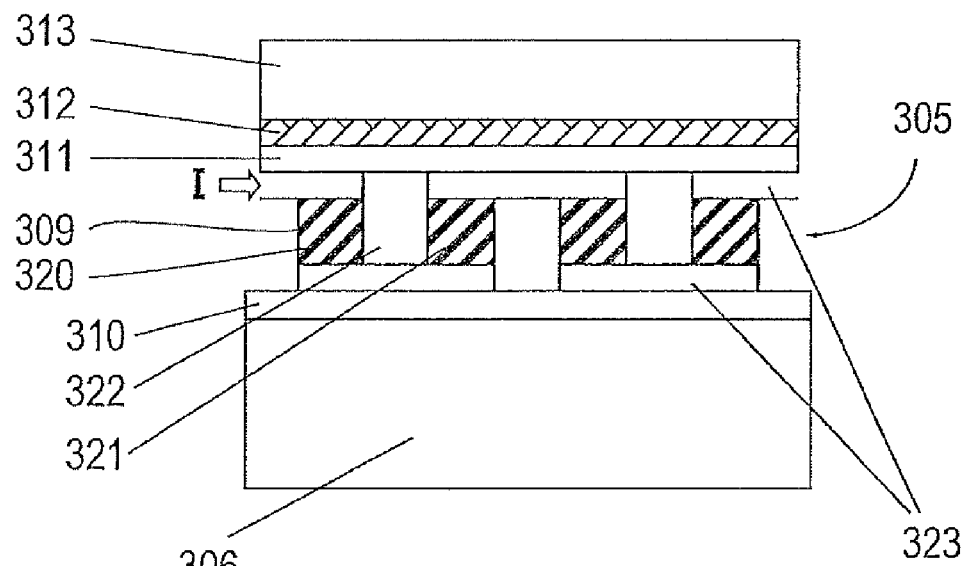
FIGS. 19a and 19b are schematics illustrating electrical interconnections among a plurality of TE generation elements.
Figure 19B:
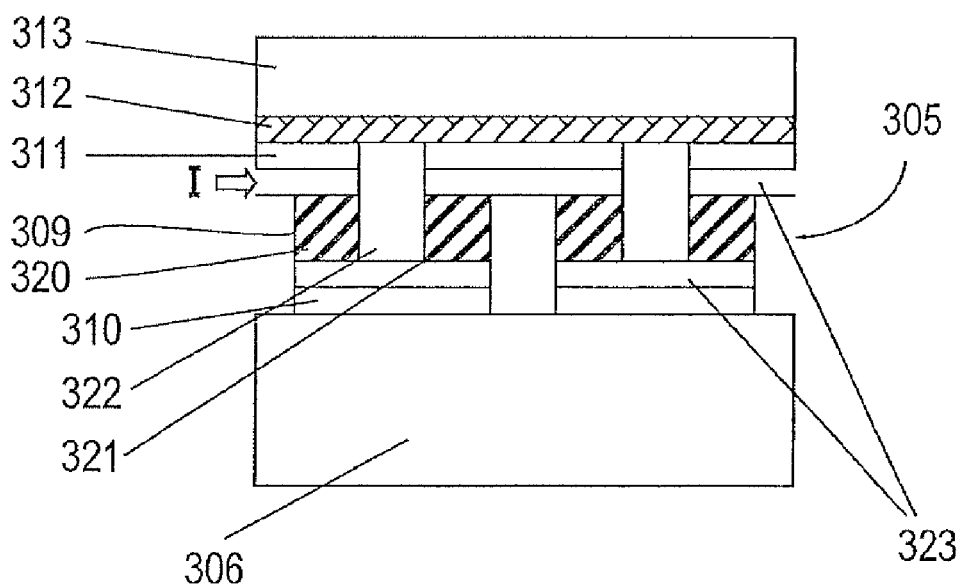

Schematics of possible electrical interconnections among the various TE generation elements 309 within an exemplary substrate 306 of FIG. 12 are illustrated in the partial cross-sectional views of FIGS. 19a and 19b (which show a view of a substrate cross-section from the center to the outer periphery). As shown, a TEG 305 may comprise various patterns of alternating TE generation elements 309. In various embodiments, for example, the TE generation elements 309 may comprise a plurality of n-type components 320 and a plurality of p-type components 321. As above, in various embodiments, the n-type components 320 and the p-type components 321 are arranged in an alternating checkerboard pattern (e.g., similar to that shown in FIG. 8b), whereas in various additional embodiments, the n-type components 320 and the p-type components 321 comprise alternating p-type and n-type cubes, hexagons, disks (e.g., similar to that shown in FIG. 8b), fins or otherwise shaped blocks.

As shown in FIGS. 19a and 19b, an electrically insulating heat transfer layer 310 (i.e., a thermal transfer medium) separates the TE generation elements 309 from the body of the substrate 306, and an electrically insulating layer 311 separates the TE generation elements 309 from the cooling medium, such as, for example, an integrated cooling circuit 308 defined by a pipe 312 configured to flow a coolant 313 therethrough. In various embodiments, for example, the insulating layers 310 and 311 can be patterned to also separate current collectors 323 on one or both of the heat source and heat sink sides. The current flowing through the current collectors 323 being depicted by the arrow and reference label I in FIGS. 19a and 19b. An air, gas or vacuum space 322 separates the n-type components 320 from the p-type components 321. As shown in FIG. 19*a*, in various embodiments, the space 322 may be lined with an electrically insulating material (i.e., insulating layers 310 and 311 are contiguous). Alternatively, as shown in FIG. 19*b*, in various additional embodiments, the current collectors 323 may be coated with an electrical insulating material (i.e., insulating layers 310 and 311 are not contiguous and match the dimensions of the current collectors 323). As would be understood by those of ordinary skill in the art, for particulate filter substrate embodiments, lining spaces 322 with an electrically insulating material (FIG. 19*a*) that is also impervious to particulates, may improve TEG function. Such a configuration, for example, may prevent conducting particulates contained in the exhaust gas from gathering immediately adjacent to the TE generation elements (which could burn during a regeneration event) and possibly create short-circuits between the TE generation elements or current collectors, and/or cause chemical and/or thermal harm to the TE generation elements.

Those of ordinary skill in the art would understand that the current collectors 323 can have various configurations and be formed from various conductive materials including, for example, metals, alloys, conductive oxides and/or other conductive ceramics. Furthermore, those of ordinary skill would understand that the TE generation elements 309 can have various configurations and/or patterns and be formed from various TE materials, including, for example, skutterudite-based TE materials, and that the configuration and material used for the TE generation elements 309 may be chosen as desired based on thermal efficiency (i.e., ZT value), cost, and other such factors.

As would also be understood by those of ordinary skill in the art, various fittings can be used to provide inlets and outlets for the coolant running through the integrated cooling circuit, as well as for the electrical power that is generated by the TEG. In various exemplary embodiments, various fittings may also be used for feedback and/or control signals. To minimize additional backpressure that may be created by the fittings, in various embodiments, fittings can be arranged with a minimum frontal area as illustrated in FIG. 20.

Figure 20:
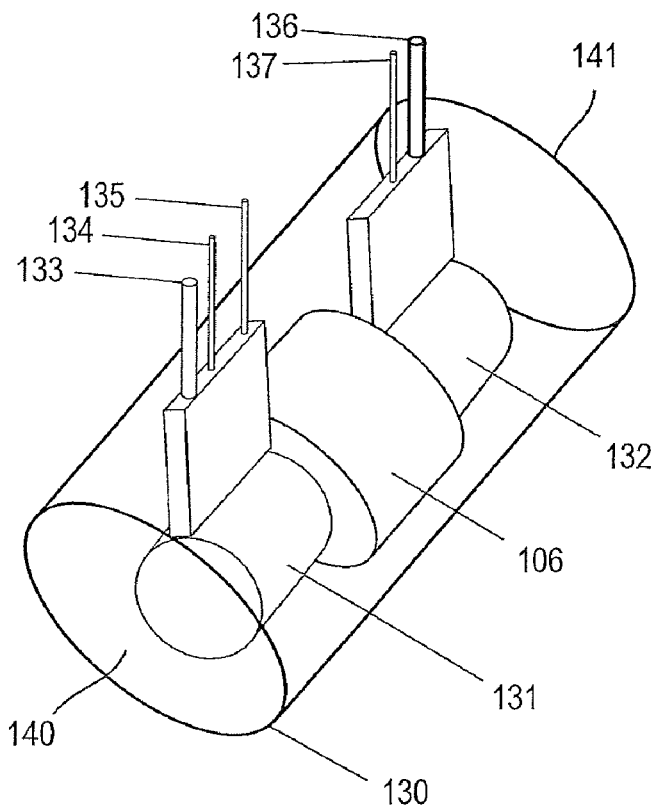
FIG. 20 is a schematic illustrating a fitting configuration for an after-treatment device having integrated TEGs.

As illustrated in FIG. 20, in various exemplary embodiments, an after-treatment device, such as the after-treatment device 100 in FIG. 8*a*, may further comprise a housing, such as, for example, an exhaust gas container 130 that contains the substrate 106. Accordingly, in various embodiments, when the substrate 106 is housed within the container 130, TE generation elements 109 (e.g., comprising the TEG 105) are disposed entirely within the container 130. Thus, to reach the TEG 105, as shown in FIG. 20, connections within an inlet fitting 131 and an outlet fitting 132 may breach the container 130, either radially (as shown in FIG. 20), or at an inlet 140 and/or outlet 141 of the container 130. The inlet fitting 131 may comprise, for example, a coolant inlet tube 133, a wire 134 for current in and control wiring 135 (if needed), and the outlet fitting 132 may comprise a coolant outlet tube 136 and a wire 137 for current out. In various embodiments, wires 134, 135 and 137 may be thermally and electrically insulated using the fittings 131 and 132.

As those of ordinary skill in the art would understand, for embodiments with multiple cavities, multiple fittings may be used, with the possibility of manifold inlets and/or outlets.

Figure 21:
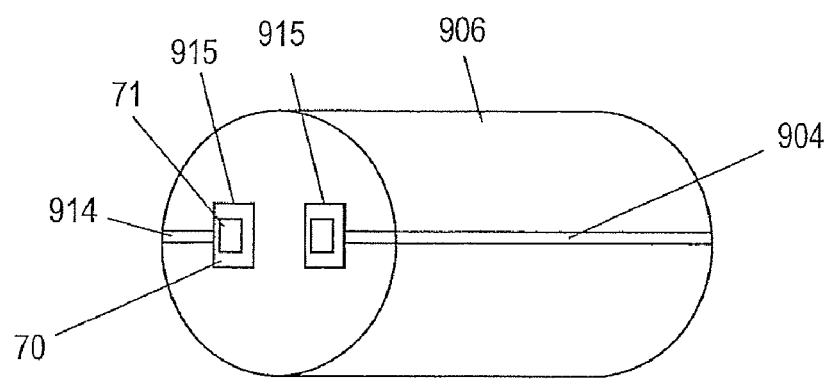
FIG. 21 shows an after-treatment device having TEGs disposed within cavities at the end of peripheral slots.

In various additional exemplary embodiments, as shown in FIG. 21, as an alternative to an enclosed cavity, at least one slot, which leads to a cavity, may be formed within a substrate and the TE generation elements and attendant coolant pipes can be disposed within the cavity and slot. For example, a substrate 906 having a pair of slots 914 that extend from a cavity 915 within the interior volume of the substrate 906 through the substrate 906 to open to an exterior of the substrate 906 is illustrated in FIG. 21. As shown in FIG. 21, each cavity 915 may comprise a volume 70 for TE generation elements (e.g., comprising a TEG) and a volume 71 for an integrated cooling circuit. In various embodiments, slots 914 may support ingress/egress of the coolant pipe and the electrical/control wires from the cavities 915 (see, e.g., FIG. 23).

Figure 22:
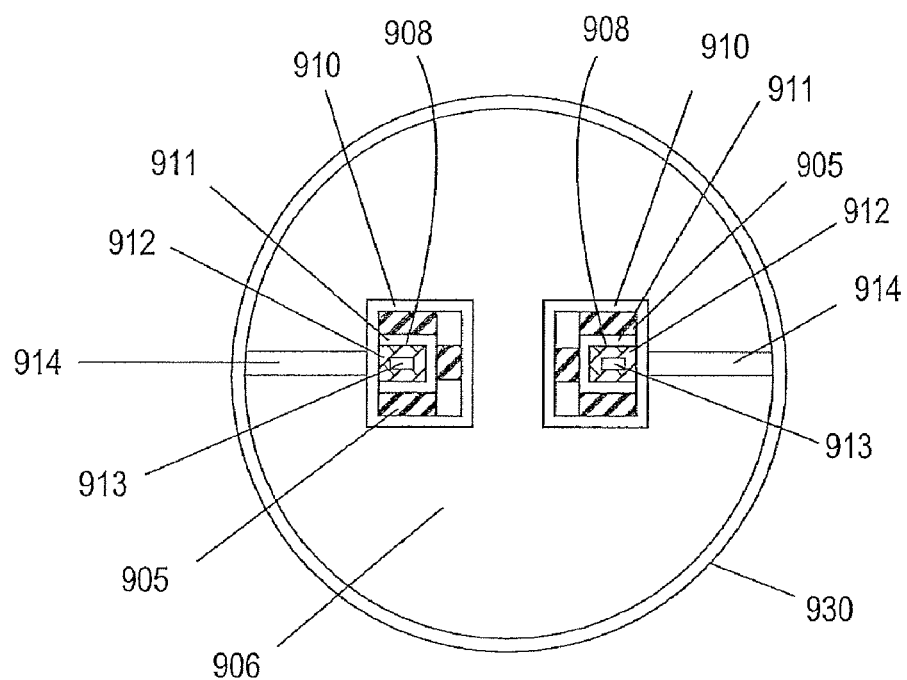
FIG. 22 shows an after-treatment device having plural TEGs and cooling channels disposed within cavities at the end of peripheral slots.

FIG. 22 illustrates a cross-sectional view of the embodiment of FIG. 21. As shown in FIG. 22, the substrate 906 is disposed within an exhaust gas container 930. TEGs 905 are fitted into the cavities 915 at the end of each slot 914. The TEGs 905 are separated from the substrate 906 by an electrically insulating heat transfer layer 910, and are separated from a central cooling circuit 908 by an optional electrically insulating layer 911. The central cooling circuit 908 is defined by a pipe 912 configured to flow coolant 913 therethrough.

As with the enclosed cavity embodiments, various fittings can be used to provide inlets and outlets for the coolant running through the integrated cooling circuit, as well as for the electrical power that is generated by the TEG. Furthermore, as above, in various exemplary embodiments, various fittings may be used for feedback and/or control signals. To minimize additional backpressure that may be created by the fittings, in various embodiments, fittings can also be arranged with a minimum frontal area as illustrated, for example, in FIG. 23.

Figure 23:
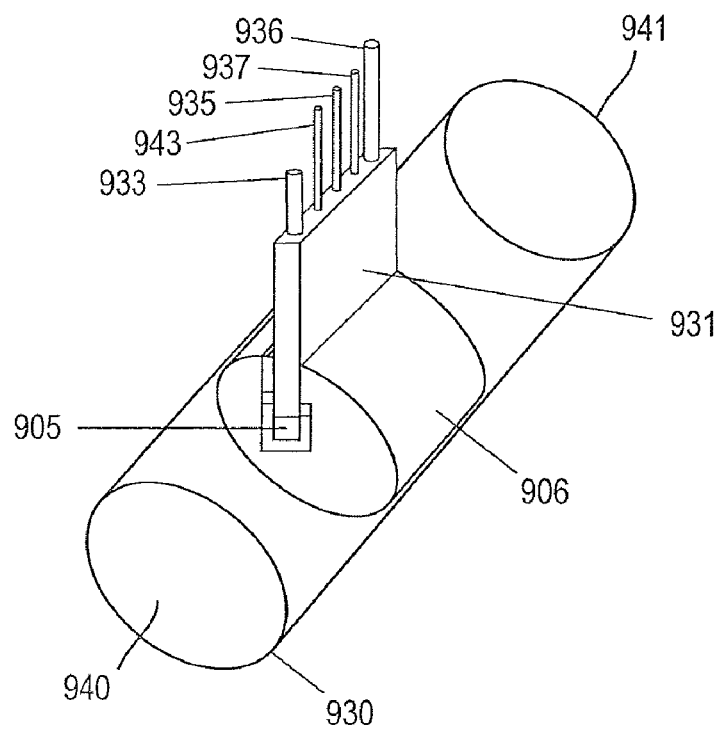
FIG. 23 is a schematic illustrating a fitting configuration for an after-treatment device having one peripheral slot.

As illustrated in FIG. 23, in various exemplary embodiments, an after-treatment device may further comprise a housing, such as, for example, an exhaust gas container 930 that contains the substrate 906. Accordingly, as before, when the substrate 906 is housed within the container 930, TEGs 905 are disposed entirely within the container 930. Thus, to reach the TEGs 909, as shown in FIG. 23, connections within a fitting 931 may breach the container 930, either radially (as shown in FIG. 23), or at an inlet 940 and/or outlet 941 of the container 930. The fitting 931 may comprise, for example, a coolant inlet tube 933, a wire 934 for current in, control wiring 935 (if needed), a coolant outlet tube 936 and a wire 937 for current out. In various embodiments, wires 934, 935 and 937 may be thermally and electrically insulated using the fitting 931.

Figure 24:
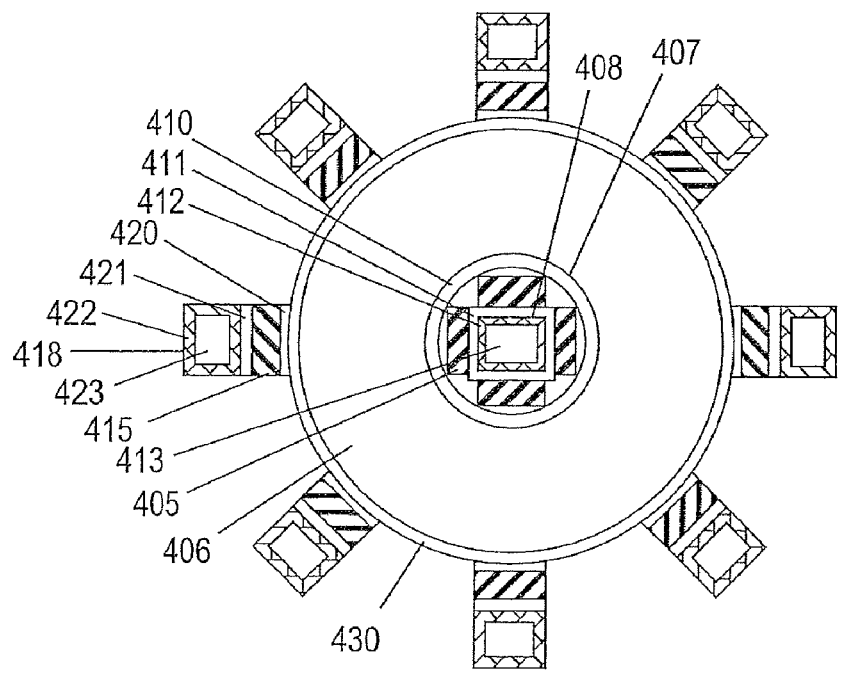
FIG. 24 shows an after-treatment device having TEGs disposed within a cavity and located around the periphery of the after-treatment device.

In various additional exemplary embodiments, as illustrated in FIG. 24, TE generation elements that are disposed within a cavity within a substrate may be further supplemented by TE generation elements located around a periphery of the after-treatment device, outside of the internal volume of the substrate (e.g., outside of the exhaust gas container). As defined herein, cavities and slots within a substrate define a volume that lies within an interior volume of the substrate. Thus, after-treatment devices in accordance with the present disclosure comprise at least one TE generation element disposed at least partially within the interior volume. After-treatment devices in accordance with the present disclosure may, however, further comprise at least one thermoelectric generation element disposed outside of the interior volume (i.e., in combination with TE generation elements within the interior volume of the substrate). Such TEGs may be used, for example, as a heater under cold start conditions to increase a temperature of a catalytic substrate in order to promote catalysis.

As illustrated in FIG. 24, an after-treatment device may comprise a substrate, such as the substrate 406 in FIG. 13, housed in an exhaust gas container 430. The substrate 406 has a central, circular cavity 407 comprising multiple rectangular TEGs 405. Within the cavity 407, an electrically insulating heat transfer layer 410 separates the TEGs 405 from the body of the substrate 406, while an optional electrically insulating layer 411 separates the TEGs 405 from an integrated cooling circuit 408 defined by a rectangular pipe 412 configured to flow a coolant 413 therethrough. As shown in FIG. 24, the after-treatment device may further comprise multiple rectangular TEGs 415 around the periphery of the exhaust gas container 430. Each TEG 415 is in thermal contact with a respective cooling circuit 418 (i.e., cooling channel) defined by a rectangular pipe 422 configured to flow coolant 423 therethrough. Individual electrically insulating heat transfer layers 420 separate each TEG 415 from the body of the exhaust gas container 430, while individual electrically insulating layers 421 separate each TEG 415 from its respective cooling circuit 418.

Figure 25:
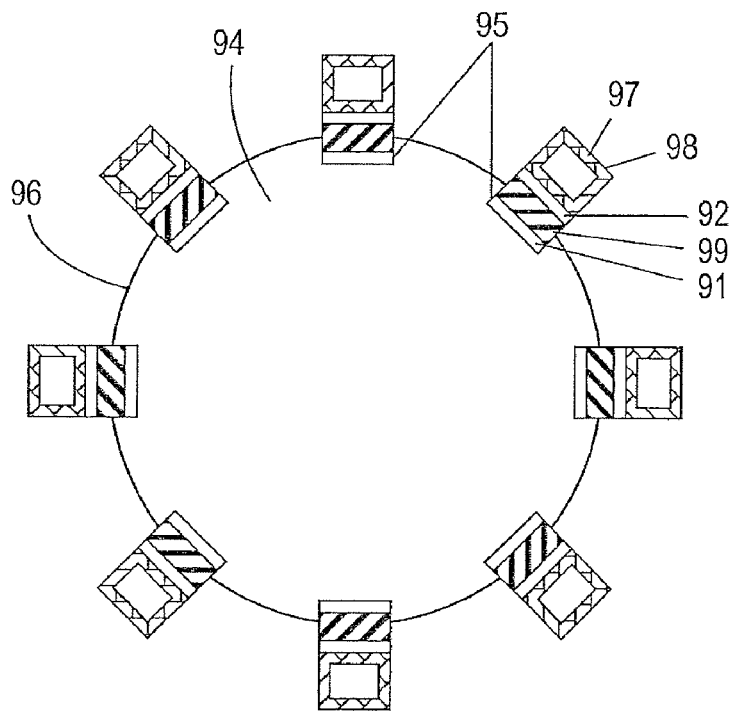
FIG. 25 shows an after-treatment device having TEGs disposed partially within the interior volume of a substrate.

As illustrated in FIG. 25, in various additional embodiments, an after-treatment device may comprise a substrate 96 having cavities 95 formed within the substrate 96. As shown in FIG. 25, TEGs 99 and attendant coolant pipes 97 can be disposed within the cavities 95 so that the TEGs 99 are disposed at least partially within the interior volume 94 of the substrate 96 (and partially outside the interior volume 94). Within each cavity 95, an electrically insulating heat transfer layer 91 separates the TEGs 99 from the body of the substrate 96, while an optional electrically insulating layer 92 separates the TEGs 99 from an integrated cooling circuit 98 defined by a pipe 97 configured to flow a coolant therethrough.

In various additional exemplary embodiments, the disclosure relates to methods for treating exhaust gas using the after-treatment devices described herein, such as, for example, using the after-treatment device 100 of FIG. 8a. More specifically, a method for dispensing exhaust gas may comprise flowing the exhaust gas through an interior volume 104 of a substrate 106 having a first end 101, a second end 102, and an outermost lateral dimension 103 defining the interior volume 104. The method may further comprise exchanging heat between the flowing exhaust gas and at least one TE generation element 109 disposed at least partially within the interior volume 104. As shown in FIG. 8a, in at least one exemplary embodiment, there may be a plurality of TE generation elements 109 forming a TEG 105 and the method may comprise generating electricity via the TEG 105 as a result of the heat exchange.

Depending on a particular application, in various embodiments, the method may further comprise reacting the flowing exhaust gas with a catalyst incorporated within the substrate 106, or filtering the flowing exhaust gas within the substrate 106.

To create a heat sink, in various additional embodiments, the method may further comprise flowing a coolant through a cooling circuit 108 in thermal communication with the TE generation element 109.

To illustrate various principles of the present teachings and demonstrate how the after-treatment devices disclosed herein can be effectively utilized to recover waste heat, experiments were conducted that modeled a TEG disposed within a catalytic converter, as shown and described in the below example with reference to Table 1 and FIGS. 26-29.

EXAMPLE

Modeling results were obtained for power production in a typical mid-size sedan by a TEG disposed within a catalytic converter comprising two honeycomb catalytic substrates: a first honeycomb catalyst substrate with a 4.28 inch diameter, a 4.53 inch length, and a 1 inch diameter central, round cavity (Sample 1, see, e.g., FIG. 12), and a second honeycomb catalyst substrate with 4.87 inch diameter, a 4.53 inch length, and a cross-shaped cavity (Sample 2, see, e.g., FIG. 17). Each substrate had the same length and frontal area for exhaust gas passage as shown in Table 1. Furthermore, an inner electrically insulating heat transfer layer (i.e. an inner mat) was placed between each substrate and cavity, and an outer electrically insulating layer (i.e., an outer mat) was placed between each substrate and metal can.

As shown in Table 1, the model considered three different substrate web thermal conductivities: k=1, 5, and 15 W/m-K, the results being shown in FIGS. 26-29.

TABLE 1

| Modeling Assumptions | | |
|---|---|---|
|  | Sample 1 | Sample 2 |
| TWC geometry: | 4.28 × 4.53 in | 4.87 × 4.53 in |
| Inner cavity size: | 1 in diameter, circular | 3 × 3 in cross |
| TE thickness: | 0.2 in | 0.2 in |
| TE effective conductivity: | 2 W/m-K | 2 W/m-K |
| Inner mat thickness: | 0.1 in | 0.1 in |
| Inner mat conductivity: | 5 W/m-K | 5 W/m-K |
| Outer mat thickness | 0.1 in | 0.1 in |
| Outer mat conductivity | 0.1 W/m-K | 0.1 W/m-K |
| Substrate conductivity: | 1 W/m-K | 1 W/m-K |
|  | 5 W/m-K | 5 W/m-K |
|  | 15 W/m-K | 15 W/m-K |
| TWC cell geometry: | 600/4 | 600/4 |
| Coolant temperature | 85° C. | 85° C. |

Figure 26:
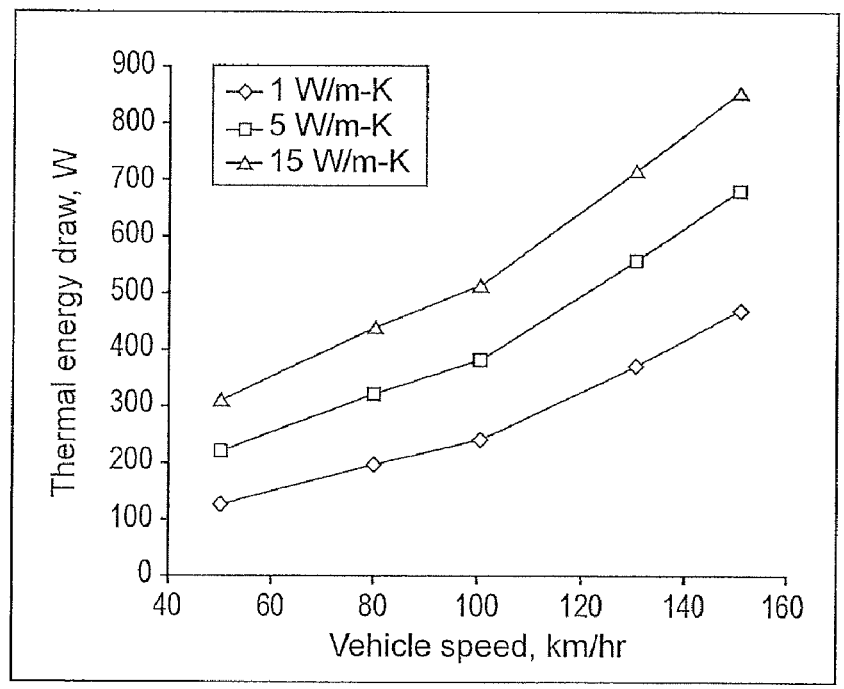
FIG. 26 shows results obtained from numerical modeling of thermal energy draw (W) as a function of vehicle speed (km/hr) for a first substrate sample.
Figure 27:
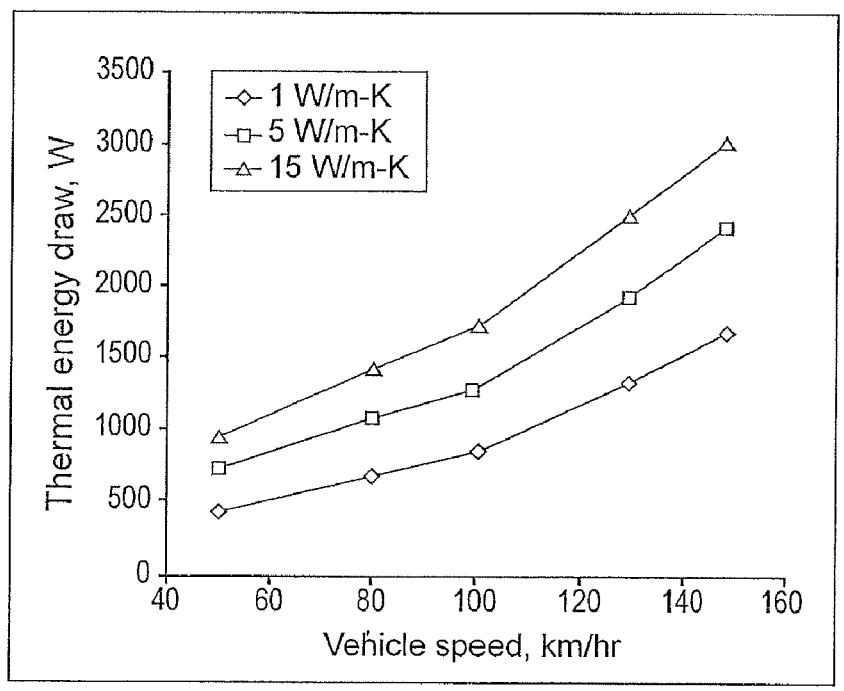
FIG. 27 shows results obtained from numerical modeling of thermal energy draw (W) as a function of vehicle speed (km/hr) for a second substrate sample.
Figure 28:
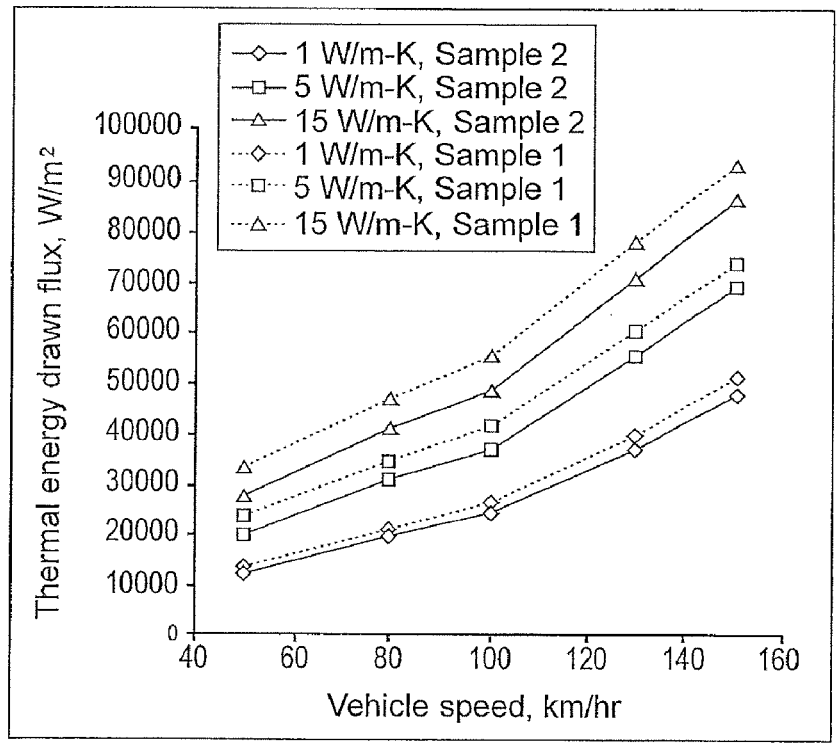
FIG. 28 shows results obtained from numerical modeling of thermal energy drawn flux (W/m$^2$) as a function of vehicle speed (km/hr) for the substrate samples of FIGS. 26 and 27.

As shown in FIGS. 26 and 27, due to the difference in surface area for heat transfer between the Samples (i.e., the surface area for heat transfer from the substrate to the TEG for Sample 2 was about 382% larger than Sample 1), the total thermal energy drawn from the TEG was larger for Sample 2 than for Sample 1. As shown in FIG. 28, however, the thermal energy drawn flux, which was measured by the total thermal energy drawn divided by the surface area for heat transfer, naturally decreased as the available surface area increased. Thus, since higher thermal energy draw results in a lower substrate temperature; the drop (i.e., flux) was relatively moderate at about 90% for both samples.

Accordingly, assuming a conversion efficiency of about 10%, an electrical power output of about 140 W was obtained for a high thermal conductivity substrate (i.e., k=15 W/m-K) at a driving speed of about 80 km/hr (see FIG. 27).

Figure 29:
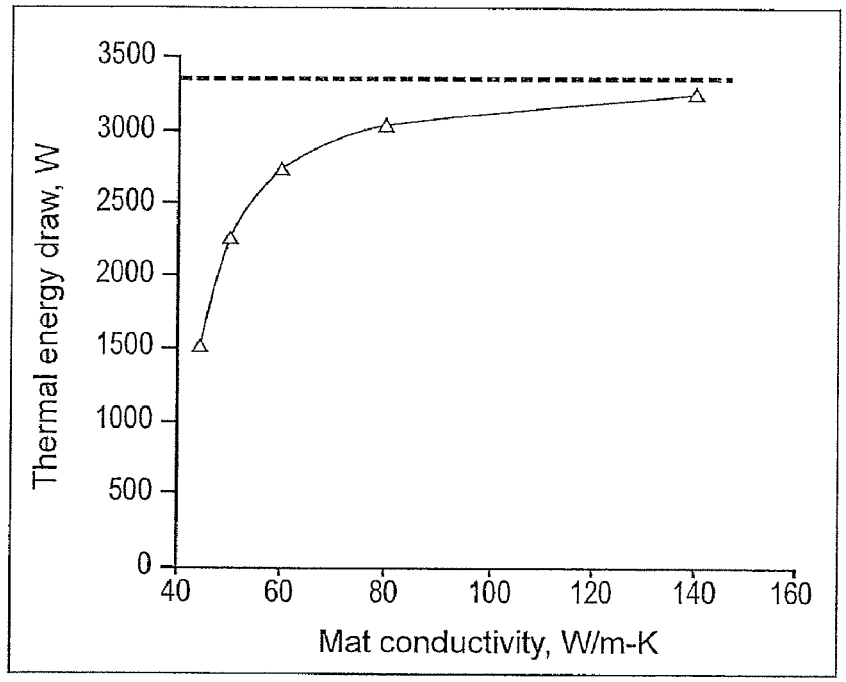
FIG. 29 shows results obtained from numerical modeling of thermal energy draw (W) as a function of inner mat conductivity (W/m-K) for the substrate sample of FIG. 27.

As shown in FIG. 29 for Sample 2, if the mat thermal conductivity was low, thermal energy drawn from the substrate was also sensitive to the inner mat material used (wherein the dotted line represents the thermal energy drawn with no inner mat). The impact was relatively high for the condition investigated (i.e., thermal energy drawn at 100 km/hr with a thermal conductivity k=5 W/m-K), for example, if the mat conductivity was lower than about 2 W/m-K.

As used herein, the singular forms "a," "an" and "the" include plural referents unless the context clearly dictates otherwise. Thus, for example, reference to a "metal" includes examples having two or more such "metals" unless the context clearly indicates otherwise.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It is also noted that recitations herein refer to a component of the present invention being "configured" or "adapted to" function in a particular way. In this respect, such a component is "configured" or "adapted to" embody a particular property, or function in a particular manner, where such recitations are structural recitations as opposed to recitations of intended use. More specifically, the references herein to the manner in which a component is "configured" or "adapted to" denotes an existing physical condition of the component and, as such, is to be taken as a definite recitation of the structural characteristics of the component.

It will be apparent to those skilled in the art that various modifications and variations can be made to the present invention without departing from the spirit and scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An exhaust gas after-treatment device comprising:
    a substrate having a first end, a second end, and an outermost lateral dimension defining an interior volume, wherein the substrate is configured to flow exhaust gas through the interior volume from the first end to the second end; and
    at least one thermoelectric generation element disposed at least partially within the interior volume.

2. The device according to claim 1, wherein the substrate comprises a catalytic substrate.

3. The device according to claim 1, wherein the substrate comprises a particulate filter substrate.

4. The device according to claim 1, wherein the substrate comprises a honeycomb structure.

5. The device according to claim 1, wherein the substrate comprises a metal or a ceramic material selected from the group consisting of cordierite, silicon carbide, silicon nitride, aluminum titanate, eucryptite, mullite, alumina, calcium aluminate, zirconium phosphate, and spodumene.

6. The device according to claim 1, wherein the at least one thermoelectric generation element is disposed within at least one cavity formed within the substrate.

7. The device according to claim 1, wherein the at least one thermoelectric generation element is in direct physical contact with the substrate.

8. The device according to claim 1, wherein the at least one thermoelectric generation element is in thermal contact with the substrate via a thermal transfer medium.

9. The device according to claim 1, further comprising a housing that contains the substrate, and the thermoelectric generation element is disposed entirely within the housing.

10. The device according to claim 1, further comprising an integrated cooling circuit in thermal contact with the at least one thermoelectric generation element.

11. The device according to claim 1, wherein the at least one thermoelectric generation element is configured to cool the substrate.

12. The device according to claim 1, wherein the at least one thermoelectric generation element is configurable to cool or heat the substrate.

13. The device according to claim 1, further comprising at least one temperature sensor configured to measure a temperature of the interior volume.

14. The device according to claim 1, wherein the at least one thermoelectric generation element comprises a plurality of p-type components and a plurality of n-type components.

15. The device according to claim 14, wherein the p-type components and the n-type components are incorporated in a thermoelectric generator.

16. The device according to claim 14, wherein the p-type components and the n-type components are arranged in an alternating checkerboard pattern.

17. The device according to claim 14, wherein the p-type components and the n-type components comprise alternating p-type and n-type disks.

18. The device according to claim 14, wherein the p-type components and the n-type components comprise alternating p-type and n-type fins.

19. The device according to claim 1, further comprising at least one thermoelectric generation element disposed outside of the interior volume.

20. The device according to claim 1, wherein the substrate comprises a substrate assembly formed from two or more substrate components.

21. A method for treating exhaust gas, the method comprising:
    flowing exhaust gas through an interior volume of a substrate having a first end, a second end, and an outermost lateral dimension defining the interior volume; and
    exchanging heat between the flowing exhaust gas and at least one thermoelectric generation element disposed at least partially within the interior volume.

22. The method according to claim 21, further comprising reacting the exhaust gas with a catalyst during the flowing through the interior volume.

23. The method according to claim 21, further comprising filtering the exhaust gas during the flowing through the interior volume.

24. The method according to claim 21, further comprising flowing a coolant through a cooling circuit in thermal communication with the at least one thermoelectric generation element.

25. The method according to claim 21, wherein the at least one thermoelectric generation element comprises a plurality of thermoelectric generation elements coupled to form a thermoelectric generator and wherein the method further comprises generating electricity via the thermoelectric generator.

* * * * *